United States Patent [19]

Roggwiller et al.

[11] Patent Number: 5,003,368
[45] Date of Patent: Mar. 26, 1991

[54] TURN-OFF THYRISTOR

[75] Inventors: Peter Roggwiller, Riedt-Neerach; Jan Voboril, Nussbaumen; Thomas Vlasak, Birr, all of Switzerland

[73] Assignee: BBC Brown Boveri AG, Baden, Switzerland

[21] Appl. No.: 229,556

[22] Filed: Aug. 8, 1988

[30] Foreign Application Priority Data

Aug. 11, 1987 [CH] Switzerland ............... 3096/87

[51] Int. Cl.$^5$ ............................ H01L 29/74
[52] U.S. Cl. ........................ 357/38; 357/39
[58] Field of Search ................... 357/38, 39

[56] References Cited

U.S. PATENT DOCUMENTS

| | | | |
|---|---|---|---|
| 4,377,816 | 3/1983 | Sittig | 357/38 |
| 4,388,635 | 6/1983 | Watanabe et al. | 357/38 |
| 4,450,469 | 5/1984 | Yamamoto | 357/38 |
| 4,630,092 | 12/1986 | Bhagat | 357/38 |
| 4,672,415 | 6/1987 | Berndes et al. | 357/38 |

FOREIGN PATENT DOCUMENTS

| | | | |
|---|---|---|---|
| 53-79471 | 7/1978 | Japan | 357/38 P |
| 2033154 | 5/1980 | United Kingdom | 357/38 |

OTHER PUBLICATIONS

Patent Abstracts of Japan, vol. 5, No. 66 (E-55) (738), May 2, 1981, & JP, A, 5617068 (Meidensha K.K.) Feb. 18, 1981.

Patent Abstracts of Japan, vol. 7, No. 239 (E-206) (1384), Oct. 25, 1983 & JP, A, 58128765 (Fuji Denki Deizo K.K.) Aug. 1, 1983.

IEEE Transactions on Electron Devices, vol. ED-23, No. 8, Aug. 1976, IEEE (N.Y., US) M. S. Adler, et al. pp. 956–960.

International Journal of Electronics, vol. 5, No. 1, 1983 (London, GB) V. P. Sundersingh et al., pp. 127–137.

5th International Colloquium on Plasmas and Sputtering, Antibes (FR), Jun. 10–14, 1985 J. Voboril et al. pp. 89–92.

IEEE Electron Device Letters, vol. EDL-1, No. 10, Oct. 1980, IEEE (N.Y., US) M. Azuma et al. pp. 203–205.

IEEE Transactions on Electron Devices, vol. ED-28, No. 3, Mar. 1981 M. Azuma et al., pp. 270–274.

Primary Examiner—Rolf Hille
Assistant Examiner—Steven Loke
Attorney, Agent, or Firm—Oblon, Spivak, McClelland, Maier & Neustadt

[57] ABSTRACT

In a high-reverse-voltage GTO thyristor, a negative beveling (6) with comparatively high beveling angle ($\alpha$) is possible as edge contouring as a result of separating the p-type base layer into a central p-type base layer (4) of small depth and high edge concentration and a p-type base edge layer (5) of greater depth and lower edge concentration.

The production of the two p-type base layers (4, 5) is preferably carried out by simultaneous diffusion of two acceptors with different diffusion constants.

3 Claims, 1 Drawing Sheet

TURN-OFF THYRISTOR

BACKGROUND OF THE INVENTION

1. Field of the Invention

The present invention relates to the field of the power semiconductor. It relates in particular to a gate turn-off thyristor for high reverse voltages, comprising a p-type emitter layer, an n-type base layer, a p-type base layer and a cathode-side gate-cathode structure in a semiconductor substrate between an anode and a cathode; and a beveling at the substrate edge to reduce the upper surface field strength.

The invention relates furthermore to a process for producing such a gate turn-off thyristor.

2. Discussion of background

For a planar pn junction in a semiconductor component, for example a high-power thyristor, to be able to block high voltages (>1000 V), special measures have to be taken in the edge region of the disk-shaped component substrate in order to reduce the increased field strength occurring at this point.

Known measures essentially comprise a lateral structuring of the doping zones, and specifically, either as external contouring by grinding off or etching out (positive, negative beveling; trench etching; mesa etching or substrate etching; in this connection see V.P. Sundersingh and A. A. Ghatol, Int. J. Electronics, Vol. 54, No.1 (1983), pages 127–137), or by introducing special doping structures (for example, in the form of so-called "guard" rings).

In the case of low-power gate turn-off thyristors, a simple trench edging which interrupts the otherwise planar pn junction between p-type base layer and n-type base layer has proved successful as edge contouring (on this point see: Brown Boveri Technik, 9 (1986), pages 519–525).

In the quite differently constructed field-controlled thyristors, the provision of a double trench which represents a combination of mesa and trench edging is furthermore known as edge contour (EP-A2-0,178,387). In order to provide sufficient space for the double trench, the very thin (5 μm) and only slightly p-type doped ($10^{16}$ cm$^{-3}$) gate region merges at the edge into a deeper-drawn edge region which may be introduced into the semiconductor substrate, for example, by the selective aluminum diffusion known from EP-A2-0,216,954.

Hitherto no detailed solutions have been specified for the edge contouring of high-reverse-voltage GTO thyristors. Thus, the publication IEEE Trans. Electron Devices, vol. ED-28, No. 3 (1981), pages 270–274 has described only a GTO thyristor having a reverse voltage of 2500 V whose edges have been beveled by sandblasting. However, the said publication does not specify either the lateral doping profile of the p-type base layer nor does it deal with the type (positive or negative), shape and position of the said beveling.

A particularly simple, inexpensive solution which is compatible with pressure contacting is the wedge-shaped partial grinding of the slice edge at a small negative angle (the abovementioned negative beveling). However, an adequate reduction in the electric field strength at the edge is only possible with this technology if the beveling angle is either extremely small (=approx. 1°) or the blocking pn junction is not too strongly asymmetrical (thickness of the pn junction >70 μm; doping concentration at the edge of the p-type profile $<5 \times 10^{17}$ cm$^{-3}$).

Applying negative beveling to high-reverse-voltage GTO thyristors with planar pn junction would therefore raise the following problem: the p-type base layer of these components has both to be highly doped (edge doping concentration $N_{po} > 10^{18}$ cm$^{-3}$) and also have a small thickness or depth (penetration depth of the p-type base layer $X_{Jp} < 70$ μm).

An adequate reduction of the edge field strength would then only be achievable with the so-called small beveling angles. Such small beveling angles require, however, a wide edge region and consequently a loss of active area. In addition, they can be produced with the necessary precision only with difficulty.

SUMMARY OF THE INVENTION

Accordingly, one object of this invention is to provide a novel high-reverse-voltage GTO thyristor and also a process for the production thereof, in which the edge field strength can be reliably and simply reduced to the required extent by a suitable bevelling.

The object is achieved in a GTO thyristor of the type mentioned in the introduction, wherein the p-type base layer is subdivided into a central p-type base layer and a p-type base edge layer which surrounds the p-type base layer, the active part of the thyristor is disposed in the region of the central p-type base layer, the p-type base edge layer has a greater thickness than the central p-type base layer, the p-type base edge layer has a lower doping concentration than the central p-type base layer, the beveling is constructed as negative beveling, the negative beveling is disposed in the region of the p-type base edge layer, and cuts the pn junction formed by the p-type base edge layer and the n-type base layer.

The central idea of the invention is to decouple the central region containing the active part and the edge region in relation to the p-type base layer so that the resultant p-type base edge layer can be optimally configured in relation to the edge beveling without regard to the active part. In this manner, a negative beveling can be employed in the high-reverse-voltage GTO thyristor with great success despite the difficult conditions.

According to a preferred embodiment of the invention, the GTO thyristor has a reverse voltage of more than 3000 V, a doping concentration at the edge of the central p-type base layer of more than $10^{18}$ cm$^{-3}$, a doping concentration at the p-type base edge layer of less than $5 \times 10^{17}$ cm$^{-3}$, a thickness of the central p-type base layer of less than 70 μm, and a thickness of the p-type base edge layer of greater than 90 μm.

The process according to the invention comprises the following steps:

a first predeposition layer containing an accepter material with a high diffusion constant is introduced into the n-type doped semiconductor substrate on the cathode side in the edge region;

a second predeposition layer containing an accepter material with a low diffusion constant is introduced into the n-type doped semiconductor substrate on the cathode side at least in the central region;

in a subsequent diffusion step, the acceptors are simultaneously diffused into the semiconductor substrate from the two predeposition layers; and after the remaining structure of the thyristor has been produced, the negative beveling is provided at the substrate edge.

According to a preferred exemplary embodiment of the process according to the invention, aluminum is used as acceptor material for the first predeposition layer and boron for the second predeposition layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1A:
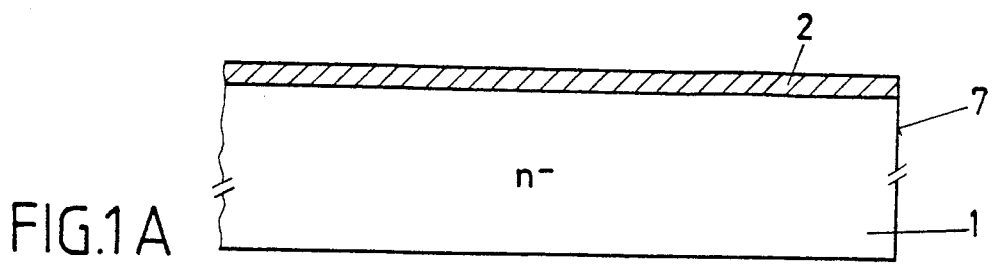
FIGS. 1A-D show various stages in the production of an exemplary GTO thyristor according to the invention.

Referring now to the drawings, wherein like reference numerals designate identical or corresponding parts throughout the several views, FIGS. 1A-D shows a part of the edge region and a small part of the central region in cross section or an exemplary GTO thyristor according to the invention at various production stages. A detailed representation of the active part of the thyristor in the central region has been omitted here for reasons of clarity.

Figure 1B:
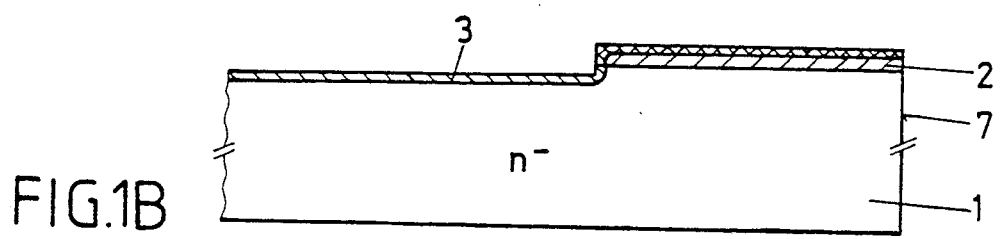
Figure 1C:
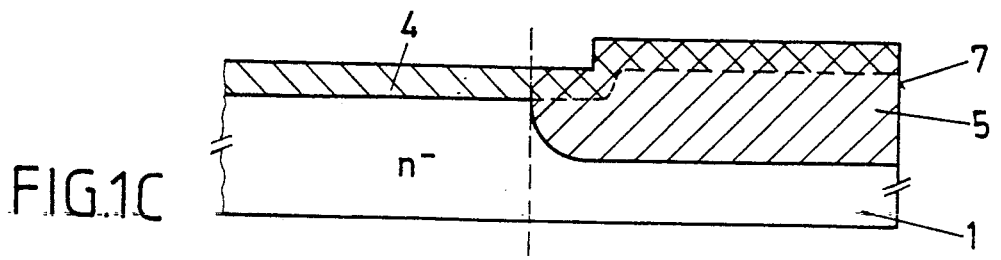
Figure 1D:
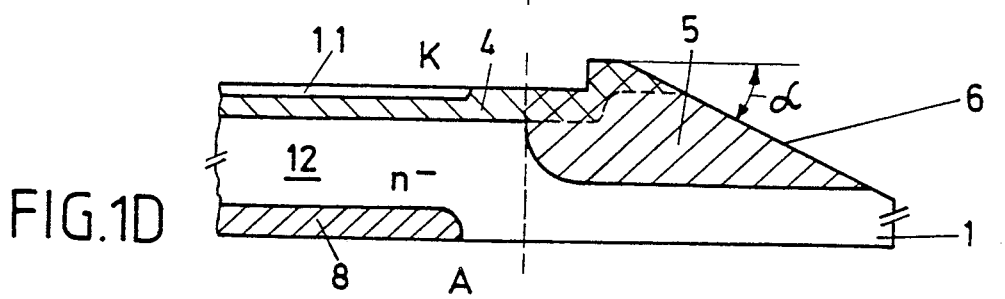

The structure of the finished thyristor is shown in FIG. 1D. It comprises a semiconductor substrate 1 with weak n-type basic doping. A p-type emitter layer 8, an n-type base layer 12, a p-type base layer and a gatecathode structure 11 are disposed in succession between an anode A and a cathode K.

The p-type base layer is divided up into a central p-type base layer 4, which is situated in the central region (on the left of the broken vertical line) of the thyristor, and a p-type base edge layer 5, which is disposed in the edge region (on the right of the broken vertical line) of the thyristor.

The p-type base edge layer 5 projects deeper into the semiconductor substrate 1 than the central p-type base layer 4. A negative beveling 6 with a beveling angle α is provided in the region of the p-type base edge layer 5 on the upper side of the semiconductor substrate 1 (the beveling is termed negative if the horizontal cross-sectional area of the substrate increases from the more highly doped to the more lightly doped layer).

The thickness of the central p-type base layer 4, i.e. the penetration depth measured from the cathode-side upper surface, is preferably less than 70 μm, the corresponding thickness of the p-type base edge layer 5, on the other hand, being greater than 90 μm.

The p-type doping concentration at the edge of the central p-type base layer 4 is preferably greater than $5 \times 10^{17}$ cm$^{-3}$, in particular greater than $10^{18}$ cm$^{-3}$, while the corresponding doping concentration of the p-type base edge layer 5 is preferably less than $5 \times 10^{17}$ cm$^{-3}$ As a result of the independent choice of the doping concentration and penetration depth parameters for the p-type base edge layer 5, the result can now be achieved that the beveling angle α of the negative beveling 6 can be adjusted to be greater than 1°, in particular between 2° and 6°, for example 3.5°. Bevellings with such a large beveling angle α can be ground without difficulty and make possible reverse voltages greater than 1000 V, in particular above 3000 V.

A preferred type of production (FIGS. 1A-D) starts from the weakly n-type doped semiconductor substrate 1 which initially has the shape of a flat disk with a vertical substrate edge 7. A first predeposition layer 2 containing an acceptor material with high diffusion constant, preferably aluminum, is introduced into the semiconductor substrate 1 in the conventional manner on the cathode side (FIG. 1A).

Since aluminum in particular cannot be masked in a suitable manner, the first predeposition layer 2 is first produced over the entire surface. The silicon material of the semiconductor substrate 1 is then etched so deeply in the central region of the component that the first predeposition layer 2 is reliably removed in this region.

In a further step, a second predeposition layer 3 containing an acceptor material with a lower diffusion constant, preferably boron, is introduced into the semiconductor substrate 1, again over the entire area (or else is restricted to the central region) (FIG. 1B). In this connection, the boron predeposition can advantageously be carried out by means of ion implantation.

A diffusion step ensues in which both acceptors are diffused into the semiconductor substrate 1 simultaneously from the corresponding predeposition layers 2, 3 (drive-in). The acceptor material with the high diffusion constant (Al) then produces a more deeply situated doping zone (the p-type base edge layer 5) than the acceptor material (B) with the low diffusion constant (FIG. 1C).

Starting from the intermediate stage of FIG. 1C, the other structures can now be introduced into the component (for example, the p-type emitter layer 8 or the gate-cathode structure 11). After the usual intermediate processes, which are not shown here, have been completed, the structure shown in FIG. 1D is achieved with the provision of the negative beveling 6 by sandblasting or grinding. Finally, the edge of the component may be passivated in the conventional manner.

To demonstrate the improvement achieved, the field strength distribution has been calculated for a selected example of the GTO thyristor according to the invention. In the example, the following parameters were used for calculation:

| | |
|---|---|
| Applied reverse voltage | 3000 V |
| Total thickness of the GTO | 400 μm |
| Specific resistance of the n-type base layer 12 | 100 ohm.cm |
| Penetration depth of the central p-type base layer 4 | 65 μm |
| Edge concentration of the central p-type base layer 4 | $2 \times 10^{18}$ cm$^{-3}$ |
| Penetration depth of the p-type base edge layer 5 | 125 μm |
| Edge concentration of the p-type base edge layer 5 | $10^{16}$ cm$^{-3}$ |
| Bevelling angle α | 3.5° |

Figure 2:
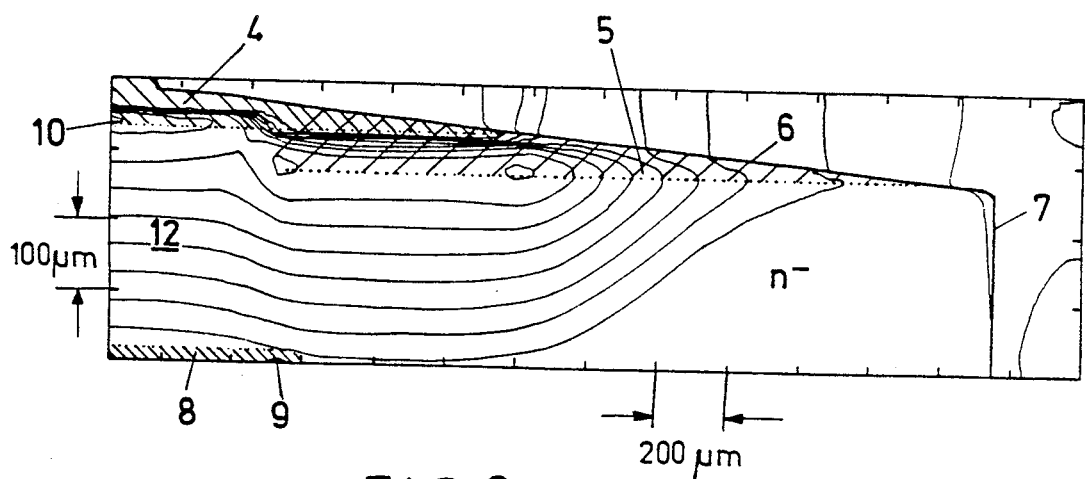
FIG. 2 shows the calculated field strength distribution for a GTO structure according to an exemplary embodiment of the invention.

The lines of equal field strength resulting from the equation are shown in FIG. 2. The dotted lines in this case indicate the boundaries of the doping zones. Starting from a field strength minimum 9 with a magnitude of 2500 V/cm, the field strength has been calculated in steps from 25000 V/cm (interval between adjacent lines) up to a field strength maximum 10 of 185424 V/cm.

As is clearly evident from the figure, the field strength maximum does not lie in the dangerous edge region, but in the active part (central region) of the structure. This means that, even with a comparatively high beveling angle of 3.5°, the field strength at the edge can be reliably kept under control in the structure according to the invention.

All in all, the invention provides a GTO thyristor which is remarkable for simple construction, easy producibility and reliable control of high reverse voltages.

Obviously numerous modifications and variations of the present invention are possible in the light of the above teachings. It is therefore to be understood that within the scope of the appended claims, the invention may be practiced otherwise than as specifically described herein.

What is claimed as new and desired to be secured by Letters Patent of the United States is:

1. A gate turn-off thyristor for high reverse voltages, comprising:
   a semiconductor substrate with an anode and a cathode;
   a p-type emitter layer, a n-type base layer, a p-type base layer and a cathode side gate-cathode structure defining an active part disposed in succession between said anode and said cathode; and
   a beveling disposed at the substrate edge to reduce the surface field strength;
   wherein:
   the p-type layer is subdivided into a central p-type base layer and a p-type base edge layer which is contiguous to and surrounds the central p-type base layer;
   the active part of the thyristor includes the central p-type base layer;
   the p-type base edge layer has a greater thickness than the central p-type base layer;
   the p-type base edge layer has a lower doping concentration than the central p-type base layer;
   the beveling is constructed as negative beveling having a beveling angle between 2° and 6°; and
   the negative beveling is disposed in the region of the p-type base edge layer and cuts the pn-junction formed by the p-type edge layer and the n-type base layer.

2. The gate turn-off thyristor as claimed in claim 1, wherein
   the doping concentration at the edge of the central p-type base layer is greater than $5 \times 10^{17}$ cm$^{-3}$, preferably greater than $10^{18}$ cm$^{-3}$;
   the doping concentration at the edge of the central p-type base layer is greater than $5 \times 10^{17}$ cm$^{-3}$;
   the thickness of the central p-type base layer is less than 70 μm; and
   the thickness of the p-type base edge layer is greater than 90 μm.

3. The gate turn-off thyristor as claimed in claim 2, wherein
   the central p-type base layer is dopes with boron.
   and the p-type base edge layer is essentially doped with aluminum.

* * * * *

UNITED STATES PATENT AND TRADEMARK OFFICE
CERTIFICATE OF CORRECTION

PATENT NO. : 5,003,368

DATED : March 26, 1991

INVENTOR(S) : Peter Roggwiller et al.

It is certified that error appears in the above-identified patent and that said Letters Patent is hereby corrected as shown below:

ON THE TITLE PAGE:

The title is incorrect, should be, --GATE TURN-OFF THYRISTOR--.

Signed and Sealed this

Thirteenth Day of October, 1992

Attest:

DOUGLAS B. COMER

Attesting Officer

Acting Commissioner of Patents and Trademarks